(12) United States Patent
Zocchi et al.

(10) Patent No.: US 8,050,380 B2
(45) Date of Patent: Nov. 1, 2011

(54) ZONE-OPTIMIZED MIRRORS AND OPTICAL SYSTEMS USING SAME

(75) Inventors: Fabio Zocchi, Samarate (VA) (IT); Jacques Kools, Simiane-Collongue (FR)

(73) Assignee: Media Lario, S.r.L., Bosisio Parini (IT)

( * ) Notice: Subject to any disclaimer, the term of this patent is extended or adjusted under 35 U.S.C. 154(b) by 17 days.

(21) Appl. No.: 12/387,625

(22) Filed: May 5, 2009

(65) Prior Publication Data
US 2010/0284511 A1  Nov. 11, 2010

(51) Int. Cl.
*G21K 5/04* (2006.01)
*G02B 5/08* (2006.01)

(52) U.S. Cl. .............. 378/34; 359/359; 250/492.2

(58) Field of Classification Search ............. 378/34; 250/492.1, 492.2, 504 R; 359/359, 360; 355/67
See application file for complete search history.

(56) References Cited

U.S. PATENT DOCUMENTS

| | | | |
|---|---|---|---|
| 5,027,377 A * | 6/1991 | Thoe ......................... | 378/145 |
| 5,283,692 A | 2/1994 | Herbst | |
| 5,911,858 A | 6/1999 | Ruffner | |
| 6,049,588 A | 4/2000 | Cash | |
| 6,317,483 B1 * | 11/2001 | Chen ............................ | 378/84 |
| 6,566,668 B2 * | 5/2003 | Rauch et al. ............... | 250/504 R |
| 6,833,223 B2 * | 12/2004 | Shiraishi ........................ | 430/5 |
| 6,927,901 B2 | 8/2005 | Mann et al. | |
| 7,173,716 B2 * | 2/2007 | Oishi et al. .................. | 356/620 |
| 7,193,228 B2 * | 3/2007 | Bowering et al. ........ | 250/504 R |
| 7,199,922 B2 * | 4/2007 | Mann et al. ................... | 359/366 |
| 7,288,778 B2 * | 10/2007 | Partio et al. ............... | 250/504 R |
| 7,403,593 B1 * | 7/2008 | He et al. ........................ | 378/85 |
| 7,405,871 B2 * | 7/2008 | Sasian ........................... | 359/351 |
| 7,460,212 B2 * | 12/2008 | Singer et al. ................... | 355/53 |
| 7,481,544 B2 * | 1/2009 | McGuire, Jr. ................ | 359/858 |
| 7,744,215 B2 * | 6/2010 | Blum et al. ................... | 351/169 |
| 7,773,196 B2 * | 8/2010 | Katsuhiko et al. ............. | 355/67 |
| 2004/0108473 A1 * | 6/2004 | Melnychuk et al. ....... | 250/504 R |
| 2006/0018429 A1 * | 1/2006 | Hoghoj et al. ................. | 378/84 |
| 2008/0042079 A1 | 2/2008 | Singer et al. | |
| 2008/0266650 A1 | 10/2008 | Sasian | |
| 2010/0151278 A1 * | 6/2010 | Zhang et al. ...................... | 429/2 |
| 2010/0245758 A1 * | 9/2010 | Lytle ............................ | 351/159 |

FOREIGN PATENT DOCUMENTS
EP  1 901 126 A1  3/2008
(Continued)

OTHER PUBLICATIONS

Zocchi et al, "Design and optimization of collectors for extreme ultra-violet lithography," Proc. SPIE vol. 6151 (2006).
(Continued)

*Primary Examiner* — Irakli Kiknadze
*Assistant Examiner* — Thomas R Artman
(74) *Attorney, Agent, or Firm* — Opticus IP Law PLLC

(57) ABSTRACT

A zone-optimized mirror (MZ) for reflecting extreme ultraviolet (EUV) or X-ray radiation (18) includes a reflective surface (S) having two or more substantially discrete zones (Z1, Z2, . . . Zn) that include respective coatings (C1, C2, . . . Cn). Each coating is configured to optimally reflect a select range of incident angles of the radiation incident thereon. An EUV optical system (10) and an EUV lithography system (200) that includes at least one zone-optimized mirror are also disclosed.

20 Claims, 13 Drawing Sheets

FOREIGN PATENT DOCUMENTS

WO WO2008/012111 1/2008
WO WO 2008/012111 1/2008

OTHER PUBLICATIONS

Windt et al, "Multilayer facilities required for extreme-ultraviolet lithography," J.Vac. Soc. Technol. B 12(6) Nov./Dec. 1994 pp. 3826-3832.

Feigl et al, "Multilayer collector optics for high-power LPP sources," Poster paper, 8th Intl. Conf. on Physics of X-ray multilayer structures, Mar. 13, 2006.

Feigl et al, "Enhanced reflectivity and stability of high-temperature LPP collector mirrors," Presentation at SPIE Advanced Lithography meeting, San Jose, CA Feb. 27, 2008.

Zocchi et al, "High-efficiency collector design for extreme-ultraviolet and X-ray applications," Appl. Opt. vol. 45, No. 35, Dec. 10, 2006 8882-88 (OSA).

* cited by examiner understand# ZONE-OPTIMIZED MIRRORS AND OPTICAL SYSTEMS USING SAME

FIELD OF THE INVENTION

The present invention relates generally to mirrors and optical systems, and in particular relates to extreme ultraviolet (EUV) and X-ray mirrors having zone-optimized reflectivity, and EUV and X-ray optical systems that use such mirrors.

BACKGROUND ART

EUV and X-ray optical systems, such as certain types of telescopes, microscopes and lithography systems, generally employ reflective mirrors rather than transmissive lenses due to the short wavelengths involved. The surfaces of such mirrors include a specialized reflective coating that provides a considerable reflectivity coefficient for electromagnetic radiation at the wavelengths of interest.

Two main types of reflective coatings are used: single layer and multiple layers (or "multilayer"). The single-layer coating is typically a thin metal layer (e.g., 100 nm of Au, Ru or Pd film) that has a high reflectivity for low grazing incidence angles $\alpha$ (i.e., where angle $\alpha$ is measured relative to the reflective surface), e.g. >80% for incidence angles a between ~0° and 18°. Single metal layers are used in so-called grazing incidence mirrors, such as Wolter type mirrors, where the radiation is incident at relatively small grazing incidence angles a, e.g. ~0° to 20°.

FIG. 1 plots the reflection coefficient R versus grazing incidence angle $\alpha$ for two Ru films. The two Ru films have different thicknesses and were formed using different thin-film deposition methods. The plot shows that the reflectivity R drops considerably for grazing incidence angles a greater than about 20°. Although one of the films displays a consistently higher reflectivity than the other, they both exhibit the characteristic drop off in reflectivity with grazing incidence angle $\alpha$, which is caused by a fundamental physical effect. Consequently, it is not expected that future advances in the film preparation method will mitigate this effect.

Multilayer coatings typically consist of a periodic or a periodic sequence of thin layers (e.g., Mo and Si layers or films) configured to have a high reflectivity R at some variable angle. Multilayer coatings are used in so-called normal incidence mirrors, where the reflection coefficient R is optimized for light at or near a normal incidence angle $\phi$ (i.e., as measured relative to the surface normal). The reflectivity R is tuned by varying the multilayer period. FIG. 2 plots the EUV reflectivity versus normal incidence angle $\phi$ for a Mo/Si multilayer coating. A broad peak at about $\phi=19°$ is evident.

Common to both types of the aforementioned mirror coatings is the fact that they are configured to be uniform over the spatial extent of the mirror. This restricts the use of the mirror to the limited angular range for which the coating is designed. Consequently, EUV and X-ray optical systems tend to require multiple mirrors, with each mirror coating configured for a different limited angular range. It is desirable to reduce the number of mirrors in such optical systems because each mirror adds to the system complexity and cost, and also decreases the system's overall optical transmission.

SUMMARY OF THE INVENTION

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

A first aspect of the invention is a zone-optimized mirror for reflecting extreme ultraviolet (EUV) or X-ray radiation. The mirror comprises a reflective surface having two or more substantially discrete zones that include respective coatings, with each coating configured to reflect a select range of incident angles of the EUV or X-ray radiation incident thereon. In example embodiments, at least one of the coatings is single layer, and one of the other coatings is multilayer.

Another aspect of the invention is a collector for collecting EUV or X-ray radiation from a radiation source. The collector includes one or more mirrors arranged about an optical axis and extending through the radiation source. At least one of the mirrors is a zone-optimized mirror having a reflective surface with two or more substantially discrete zones. Each zone has a coating configured to reflect a select range of angles of the EUV or X-ray radiation incident thereon.

Another aspect of the invention is an EUV or X-ray lithography system. The system includes a source of EUV or x-ray radiation, and the collector optical system as described briefly above, which is configured in the system to collect the EUV or x-ray radiation. The system also includes an optical condenser configured to receive EUV or x-ray radiation from the collector and direct it to a reflective mask, which includes a pattern to be imaged onto a photosensitive surface of a semiconductor wafer in the process of making integrated circuit (IC) chips.

Another aspect of the invention is an imaging system for imaging extreme ultraviolet (EUV) or X-ray radiation, comprising at least one zone-optimized mirror as described hereinbelow.

Another aspect of the invention is a method of forming a zone-optimized mirror for EUV or X-ray wavelength radiation. The method includes dividing a mirror surface into a number n of zones Zn, and determining for each zone a corresponding incidence angular range of incidence angles for radiation incident on the mirror surface. The method also includes determining an optimal coating Cn for each zone Zn that substantially optimizes a reflectivity Rn of radiation for the corresponding incidence angular range. The method also includes depositing for each zone Zn the corresponding coating Cn that substantially optimizes the reflectivity Rn.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

Figure 1:
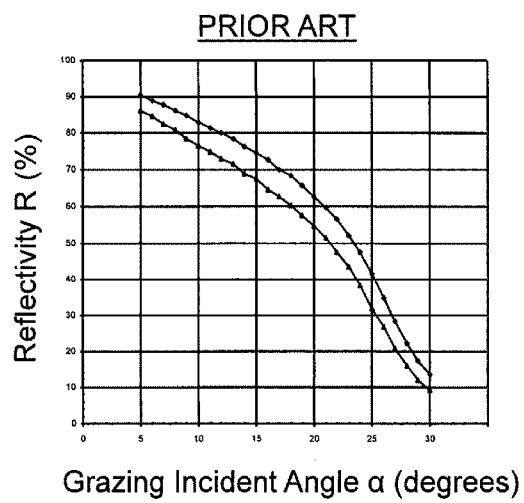
FIG. 1 plots the reflection coefficient R (%) versus grazing incidence angle a (in degrees) for two Ru films of different thickness.
Figure 2:
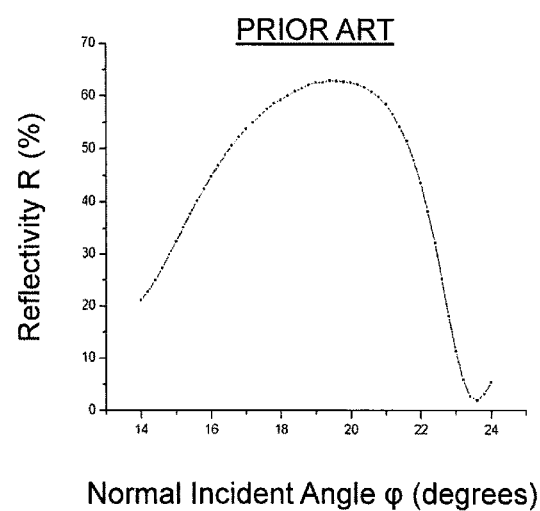
FIG. 2 plots the EUV reflectivity R (%) versus normal incidence angle $\phi$ (degrees) for a Mo/Si multilayer coating.

The various elements depicted in the drawing are merely representational and are not necessarily drawn to scale. Certain sections thereof may be exaggerated, while others may be minimized. The drawing is intended to illustrate an example embodiment of the invention that can be understood and appropriately carried out by those of ordinary skill in the art.

DETAILED DESCRIPTION OF THE INVENTION

The present invention relates generally to mirrors and optical systems, and in particular to extreme ultraviolet (EUV) and X-ray mirrors having zone-optimized reflectivity, and EUV and X-ray optical systems that use such mirrors.

In the discussion below, a "grazing incidence angle" is identified by α and is measured relative to the surface in question, while a "normal incidence angle" is identified by ϕ and is measured relative to the surface normal N (FIG. 3) of the surface in question. Thus, $\phi = 90° - \alpha$. One skilled in the art will therefore appreciate that both of these angles are "incident angles" and that either of these angles may be used to describe the principles of operation of the present invention, and that the use of one or the other is non-limiting. In the claims, one skilled in the art will understand that one type of incident angle is equivalent to the other.

Ranges of angles are denoted by Δ, such as "incidence angular range Δϕ", "grazing incidence angle range Δα" and "source angular range Δθ".

Zone-Optimized Mirror

Figure 3:
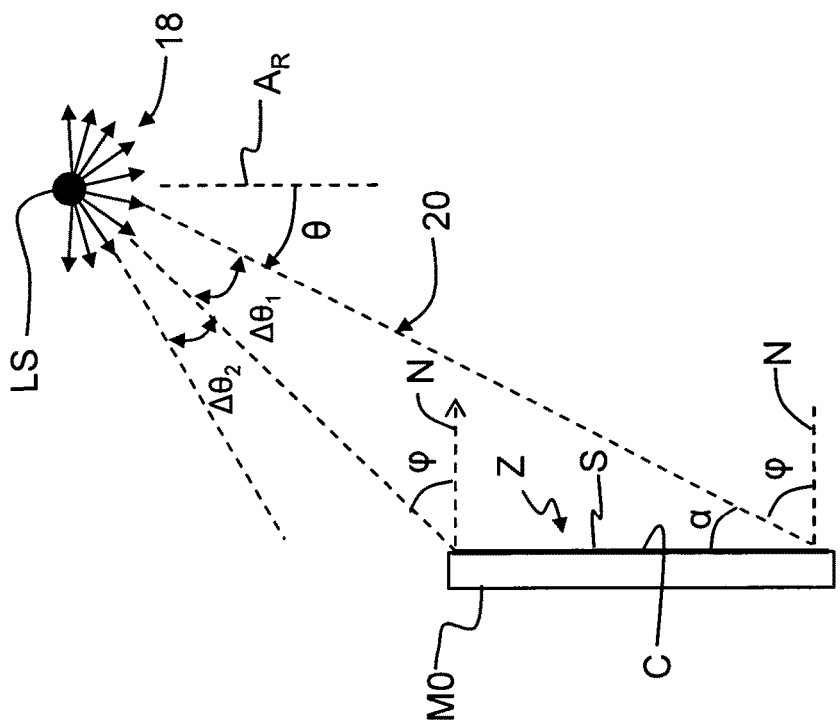
FIG. 3 is a schematic diagram of a prior art EUV or X-ray mirror having a spatially uniform single-layer coating over a single mirror zone.

FIG. 3 is a schematic diagram of a prior art EUV or X-ray mirror M0 having a surface S with a coating C thereon. Coating C consists of a single layer (film) that is substantially spatially uniform over a single mirror "zone" Z. Mirror M0 is shown arranged relative to a radiation source LS that generates EUV or X-ray electromagnetic radiation 18 in the form of photons at angles θ relative to a reference axis AR. Emitted radiation 18 is schematically represented by light rays 20 having an EUV or X-ray wavelength λ. Mirror M0 is configured to receive light rays 20 in what can be described as a single zone Z over a limited source angular range $\Delta\theta_1$ and thus a limited normal incidence angular range $\Delta\phi_1$ of normal-incidence light-ray angles ϕ.

Figure 4:
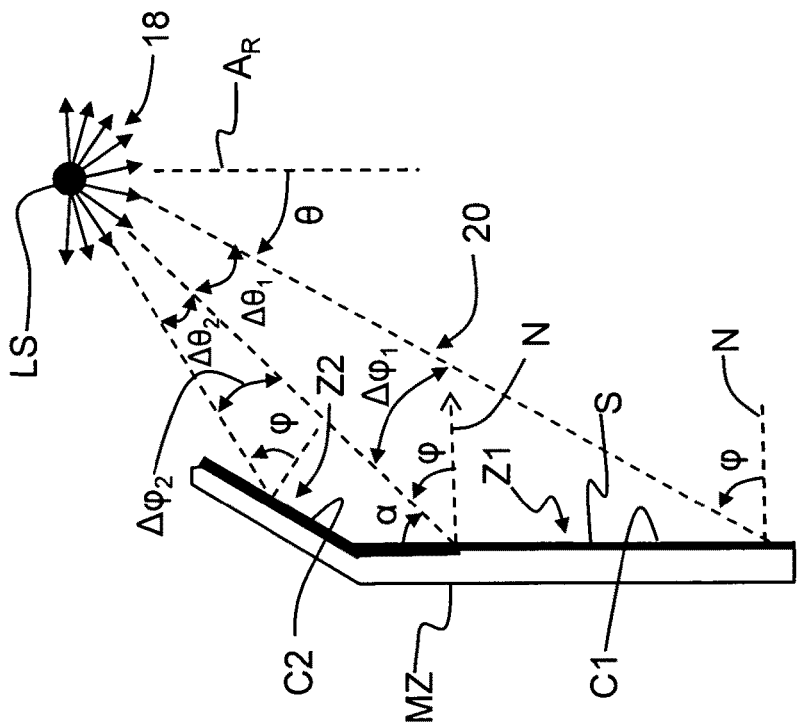
FIG. 4 is a schematic diagram similar to that of FIG. 3, but that illustrates an example of a zone-optimized mirror having two zones with different reflectivity coatings.

FIG. 4 is a schematic diagram similar to that of FIG. 3 but that illustrates an example of a zone-optimized mirror MZ according to the present invention, wherein surface S is divided up into two zones Z1 and Z2. Zone Z1 includes a first coating C1, e.g., a single-layer coating, that is configured to provide a select reflectivity R1 for light rays 20 in a first source angular range $\Delta\theta_1$. Zone Z2 includes a second coating C2, e.g., a multilayer coating, that is configured to provide a select reflectivity R2 for light rays 20 in second source angular range $\Delta\theta_2$. The coatings Cn for different zones Zn can also be single-layer coatings, e.g., an Mo coating for the smaller grazing incidence angles α and a Ru coating for the larger (grazing) incidence angles.

Based on the realization that the angle of incidence ϕ of light rays 20 arriving at a certain points on EUV and X-ray mirrors is within a narrow range Δϕ of incidence angles, coatings C1 and C2 are selected by mapping positions on surface S of mirror MZ to the corresponding incidence angles ϕ and applying a different coating on the different mirror zones.

An exemplary method of forming zone-optimized mirror MZ includes dividing mirror surface S into a number (n) of zones Z1, Z2, ... Zn. The method also includes determining for each zone Zn the corresponding incidence angular range $\Delta\phi_n$ of incidence angles ϕ for light (radiation) incident thereon. The method further includes determining the optimal coating C1, C2, ... Cn for each zone Zn that substantially optimizes the reflectivity Rn of light rays 20 for the corresponding incidence angular range $\Delta\phi_n$. The method then includes depositing for each zone Zn a corresponding coating Cn that substantially optimizes the corresponding zone reflectivity Rn. Generally, the reflectivity Rn for a given zone Zn is greater than the reflectivity of adjacent zones (i.e., Rn−1 for zone Zn−1, Rn+1 for zone Zn+1, etc.) for the given zone's incidence angular range $\Delta\phi_n$. In other words, each zone is configured to have substantially optimized reflectivity Rn for its own incidence angular range $\Delta\phi_n$ and applying radiation over a different incidence angular range (say, $\Delta\phi_{n-1}$) to this same zone Zn would result in a lower reflectivity.

With reference to the example zone-optimized mirror MZ of FIG. 4, an example coating C1 for zone Z1 is a single Mo layer that handles the smaller grazing incidence angles α, while an example coating C2 for zone Z2 is a multilayer Mo/Si coating that handles the larger grazing incident angles α. As shown in FIG. 4, zone-optimized mirror MZ is able to receive and reflect a larger angular range Δθ of light rays 20 from radiation source LS than prior art mirror M0 of FIG. 3.

Figure 5A:
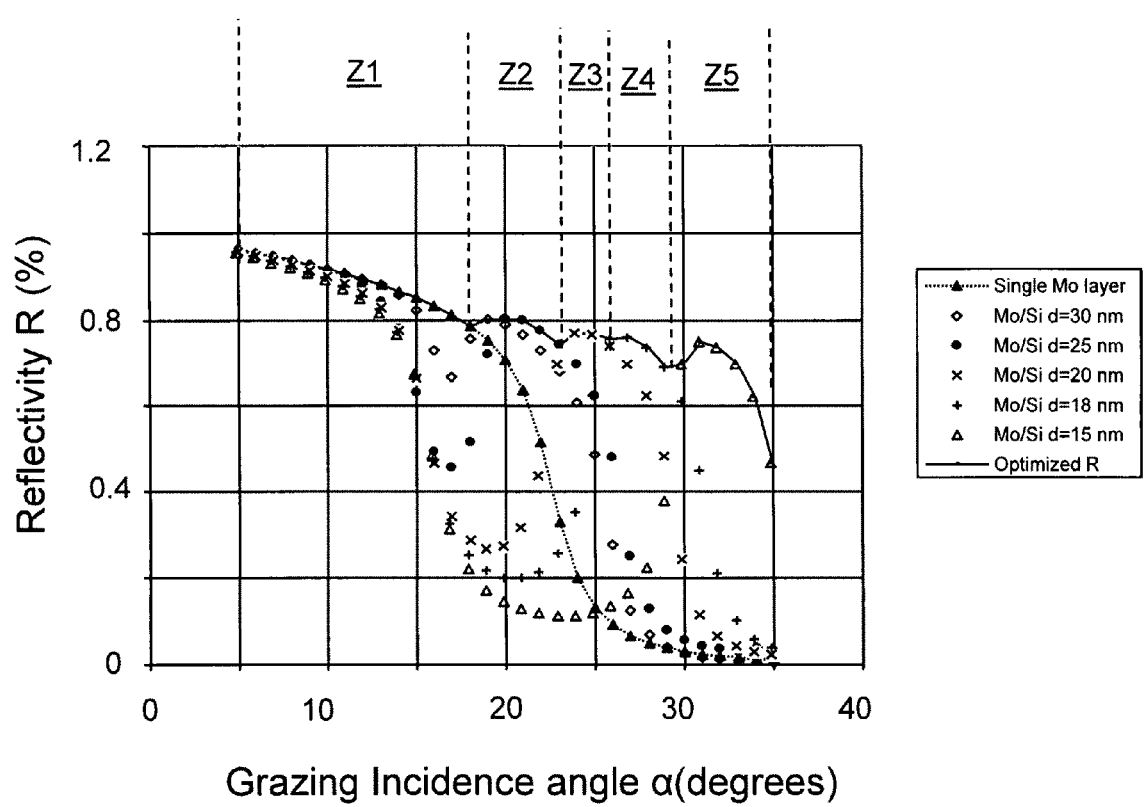
FIG. 5A is a plot of reflectivity R (%) vs. grazing incident angle α (degrees) for a single-layer and a number of different multilayer reflective coatings, illustrating an optimized reflectivity for five zones for the corresponding zone-optimized mirror.

FIG. 5A is a plot of reflectivity R (%) vs. grazing incidence angle α (degrees) for a number of different reflective coatings Cn, namely a single Mo layer (dotted line), a series of Mo/Si multilayers with different film spacings (periods) d, and the corresponding optimized reflectivity for the corresponding zones Z1 through Z5 for the corresponding zone-optimized mirror MZ (solid line). It can be seen from the plot of FIG. 5A that the zone-optimized mirror MZ significantly increases the grazing incidence angular range $\Delta\alpha$ over which mirror MZ receives and reflects light rays 20. It is also notable in FIG. 5A that the reflectivity R in each zone Zn need not be constant, and in most cases will not be constant. Rather, the reflectivity R will typically spatially vary over each zone Zn, such as in the manner shown in FIG. 5A. In this case, each zone Zn has a corresponding average reflectivity Rn.

Adjacent zones Zn are preferably defined by a relatively sharp transition region. Ideally, such a transition region would be a perfect edge or step. However, manufacturing and/or processing realities will often result in a smooth or smeared transition region between adjacent zones. Thus, zones Zn are said to be "substantially discrete" zones because the transition region need not be sharp.

Figure 5B:
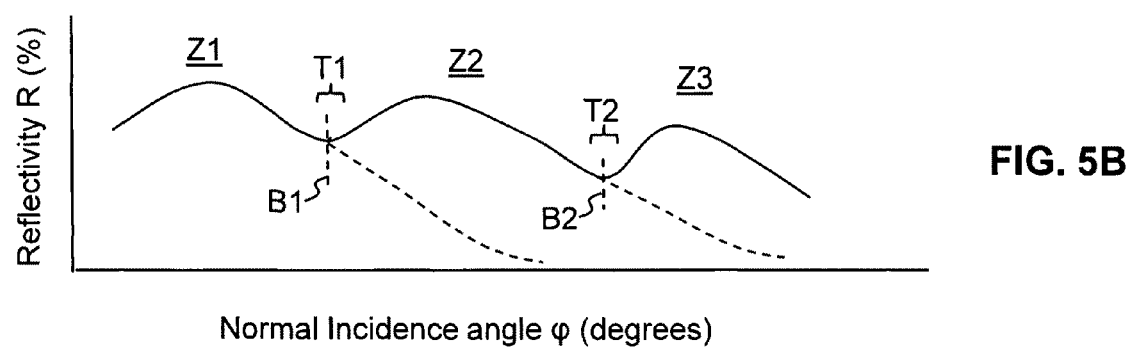
FIG. 5B is a schematic version of a plot similar to that of FIG. 5A, showing an example where there are smooth transition regions between adjacent zones.

FIG. 5B is a schematic version of a plot similar to that of FIG. 5A, showing a smooth transition region T1 between zone Z1 and Z2, and a smooth transition region T2 between zone Z2 and Z3. A boundary Bn between adjacent zones Zn can be defined in a number of ways when there is a smooth transition region Tn, such as by a local reflectivity minimum (e.g., as shown in FIG. 5B), a reflectivity inflection point, etc. This smooth transition does not in general result in a significant performance loss.

The ability of zone-optimized mirror MZ to receive and reflect a greater angular range of incident light than prior art mirror M0 increases the available design space for mirror-based EUV and X-ray optical systems. An example of an optical system design that employs two zone-optimized mirrors MZ and that has a reduced number of mirrors as compared to the corresponding prior art design is described in greater detail below.

In an example embodiment, zone-optimized mirror MZ operates over an grazing incidence angular range $\Delta\alpha$ of $0° \leq \alpha \leq 30°$ or in some cases $0° \leq \alpha \leq 40°$, as compared to the corresponding prior art range $\Delta\alpha$ of about $0° \leq \alpha \leq 20°$. In an example EUV-wavelength zone-optimized mirror MZ, the collection efficiency was significantly improved, e.g., by about 20%. For other examples, a greater collection efficiency improvement can be achieved. Greater collection efficiency translates directly to improved optical system performance. For example, an increase in collection efficiency translates into increased throughput for an EUV-based lithography system.

With reference again to FIG. 5A, the present invention allows for the creation of a single zone-optimized mirror MZ that operates over a very wide angular range. For example, the plot of FIG. 5A illustrates the reflectivity R of a zone-optimized mirror MZ having a grazing incidence angular range $\Delta\alpha$ of about $5° \leq \alpha \leq 35°$ by using five mirror zones Z1 through Z5 having select reflectivities R for corresponding grazing incidence angular ranges $\Delta\alpha_1$ through $\Delta\alpha_5$. However, the overall incidence angular range $\Delta\alpha$ can be expanded so that it ranges from about 0° at the low end to up to about 90° at the high end by continuing to add zones Z6, Z7, ... Zn each having select reflectivities R6, R7, ... Rn over corresponding incidence angular ranges $\Delta\alpha_6$, $\Delta\alpha_7$, ... $\Delta\alpha_n$. Thus, an aspect of the present invention removes the limitation that a given EUV or X-ray mirror be one of a "grazing incidence" or "normal incidence" mirror, and creates a new type of hybrid EUV or X-ray mirror that operates within both of these extremes.

Example Fabrication Method

In an example embodiment, coatings Cn for normal-incidence and glancing-incidence zone-optimized EUV and X-ray mirrors MZ are applied to the mirror surface using Physical Vapor Deposition (PVD), also known as magnetron sputtering. Alternatively, in other example embodiments, coatings Cn can be applied using other deposition techniques, such as electroforming, evaporation, or ion beam deposition (IBD). In an example embodiment, the reflective surface of the zone-optimized mirror MZ is supported by an electroformed monolithic structure, e.g., a rigid shell configured so that the reflective surface has a select curvature.

Figure 6:
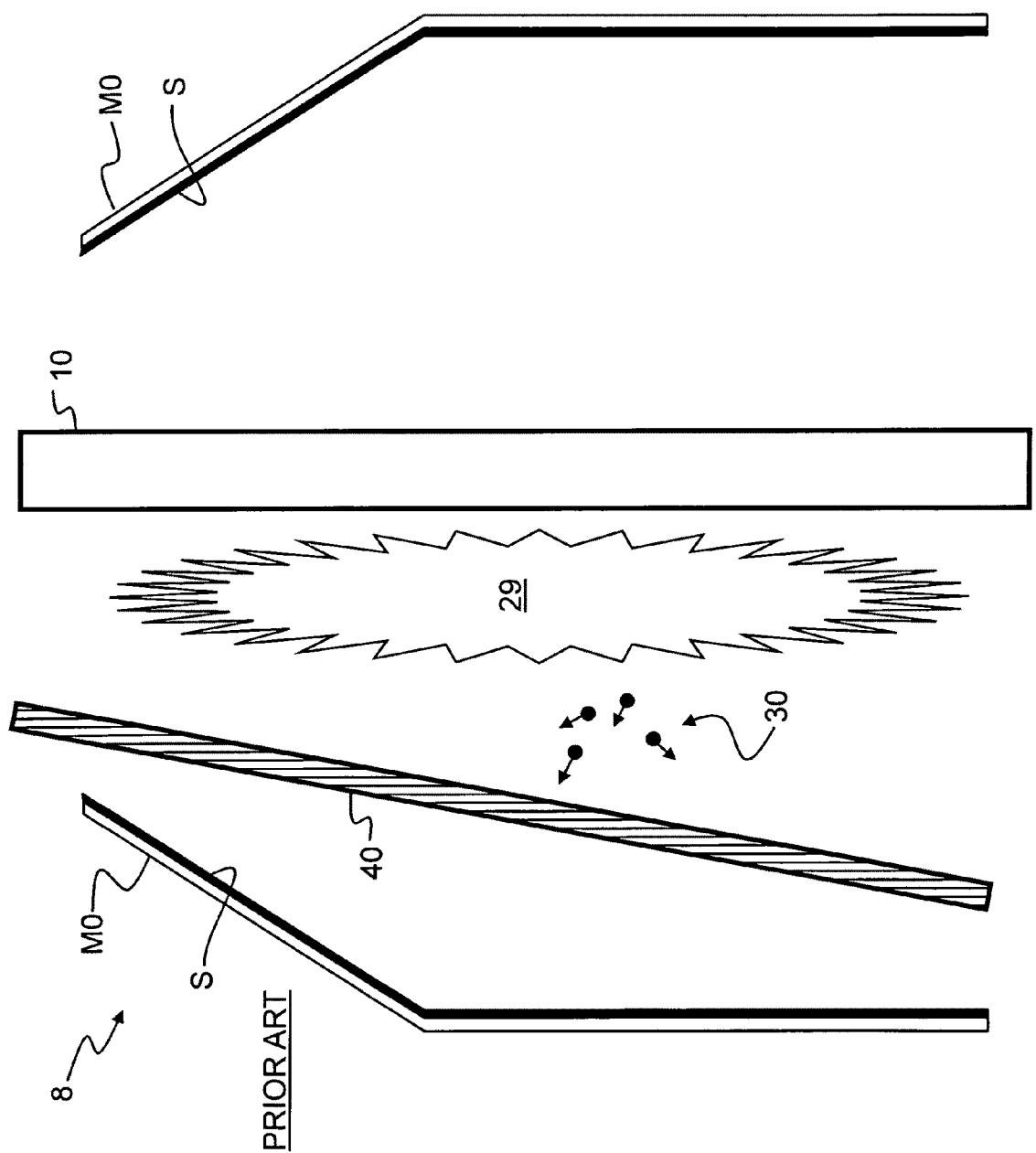
FIG. 6 is a schematic cross-sectional view of a generalized Physical Vapor Deposition (PVD) system used for forming a spatially uniform coating to form a mirror according to the prior art.

FIG. 6 is a schematic cross-sectional view of a generalized PVD system 8 used for forming a spatially uniform coating to form prior art mirror M0. A target 10 is mounted in a vacuum chamber (not shown) facing the sides S of the mirror M0 to be coated. The two halves of shell-type mirror M0 are shown. A plasma 29 is struck, and ions extracted from the plasma erode target 10. This results in an atomic flux 30 that traverses the vacuum chamber to deposit coating C on surface S. A mechanical shutter 40 is used to selectively block this flux and control the deposition process. This results in a substantially uniform coating C. For mirrors with cylindrical symmetry such as mirror shell M0, the mirror (or plasma source) is rotated around the vertical axis to ensure uniform deposition at different polar angles.

For depositing a multilayered coating C, the arrangement of FIG. 6 is extended to include a second target 10 and a second shutter 40, allowing for sequential deposition of multiple individual and substantially spatially uniform layers in a single vacuum run. The two targets 10 can be operated simultaneously, in which case the multilayer period is determined by the rotation speed and respective deposition rates. Most modern PVD systems have high degree of automation. All major operations, such as shutter motion, target power activation, etc., are computer controlled.

In an exemplary embodiment of the invention, the above-described PVD system and method is modified to allow for the deposition of coatings Cn in multiple mirror zones Zn to form zone-optimized mirror MZ. In one example, the modified PVD method includes coating the entire mirror surface S with one material, preferably the multilayer material. Part of the mirror surface S is then masked, e.g., by applying a mechanical mask, or by covering the surface with a sacrificial lift-off layer, such as photoresist, to be removed later. One or more additional coating layers are then deposited atop of the first layer in the unmasked areas. As discussed above, the boundary between adjacent zones Zn may not be perfectly sharp due to manufacturing and process limitations.

Figure 7:
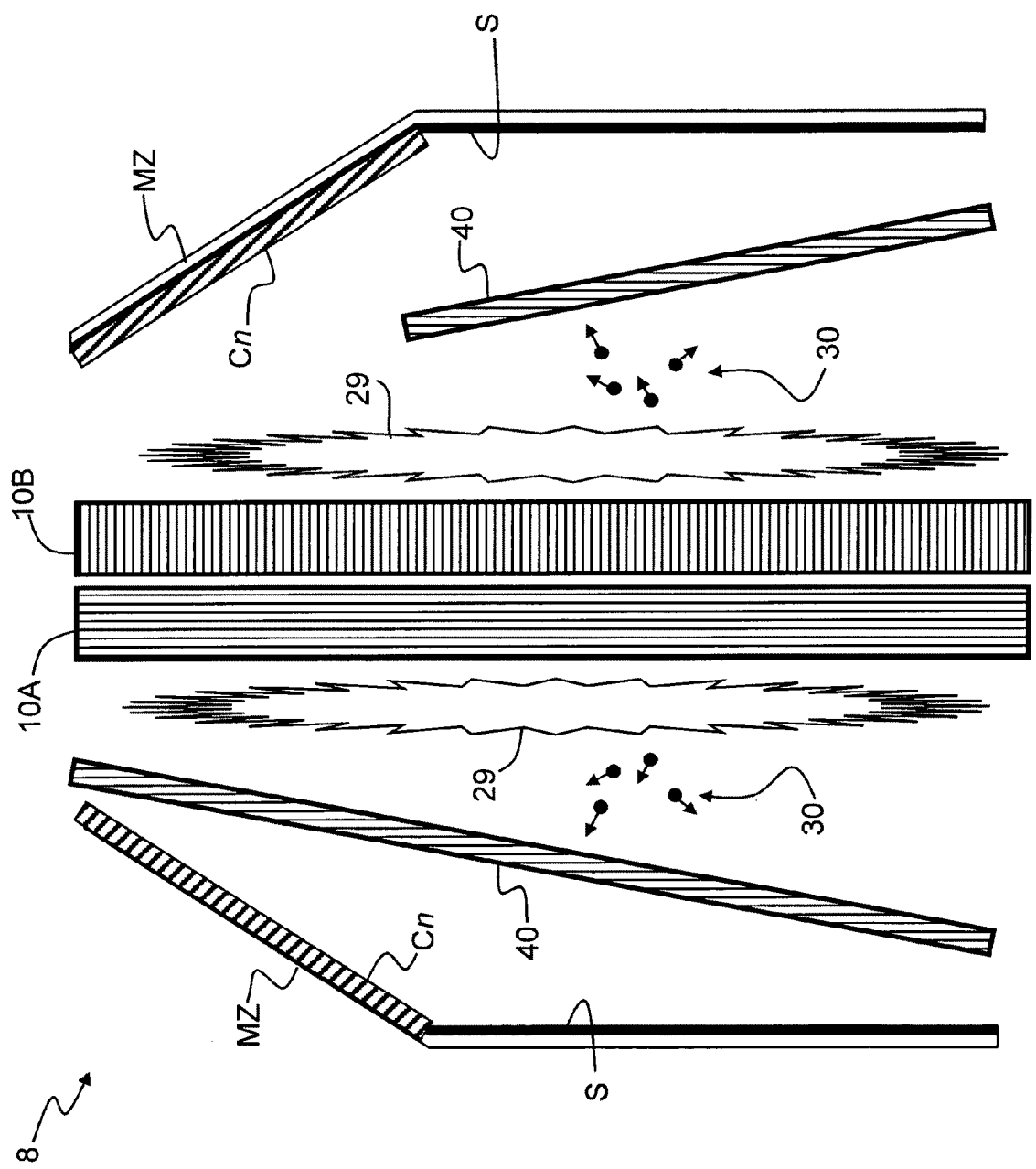
FIG. 7 is a schematic diagram of an example PVD system similar to that of FIG. 6 but modified to form the different coatings Cn for different mirror zones Zn.

In another exemplary embodiment, coatings Cn are deposited in a single operation or "run" of the PVD system. FIG. 7 is a schematic diagram of an example PVD system 8 similar to that of FIG. 6 but that is modified to form different coatings Cn for the different mirror zones Zn. Modified PVD system 8 includes two targets 10A and 10B made of different coating materials (e.g. Molybdenum and Silicon). PVD system 8 also includes a modified shutter 40 configured to also act as a shadow mask, thereby allowing for the spatial modulation of atomic flux 30 for the particular target 10A and 10B. In its most simple form, the atomic (e.g., silicon atom) flux 30 is completely blocked for part of mirror surface S.

In an example embodiment, shutter 40 has a different transmission for target 10A than for target 10B. As a consequence, part of mirror surface S is coated with a single layer of material (e.g. pure Molybdenum), while another part is coated by a multilayer (e.g. Mo/Si). As a refinement, the shutter opening is varied with position, which varies the effective Mo and Si deposition rates at different heights and thus the resulting multilayer periods at different heights. In one example, the shadowing and shuttering functions are decoupled by inserting an additional mechanical component (not shown).

Zone Tolerances

Figure 8:
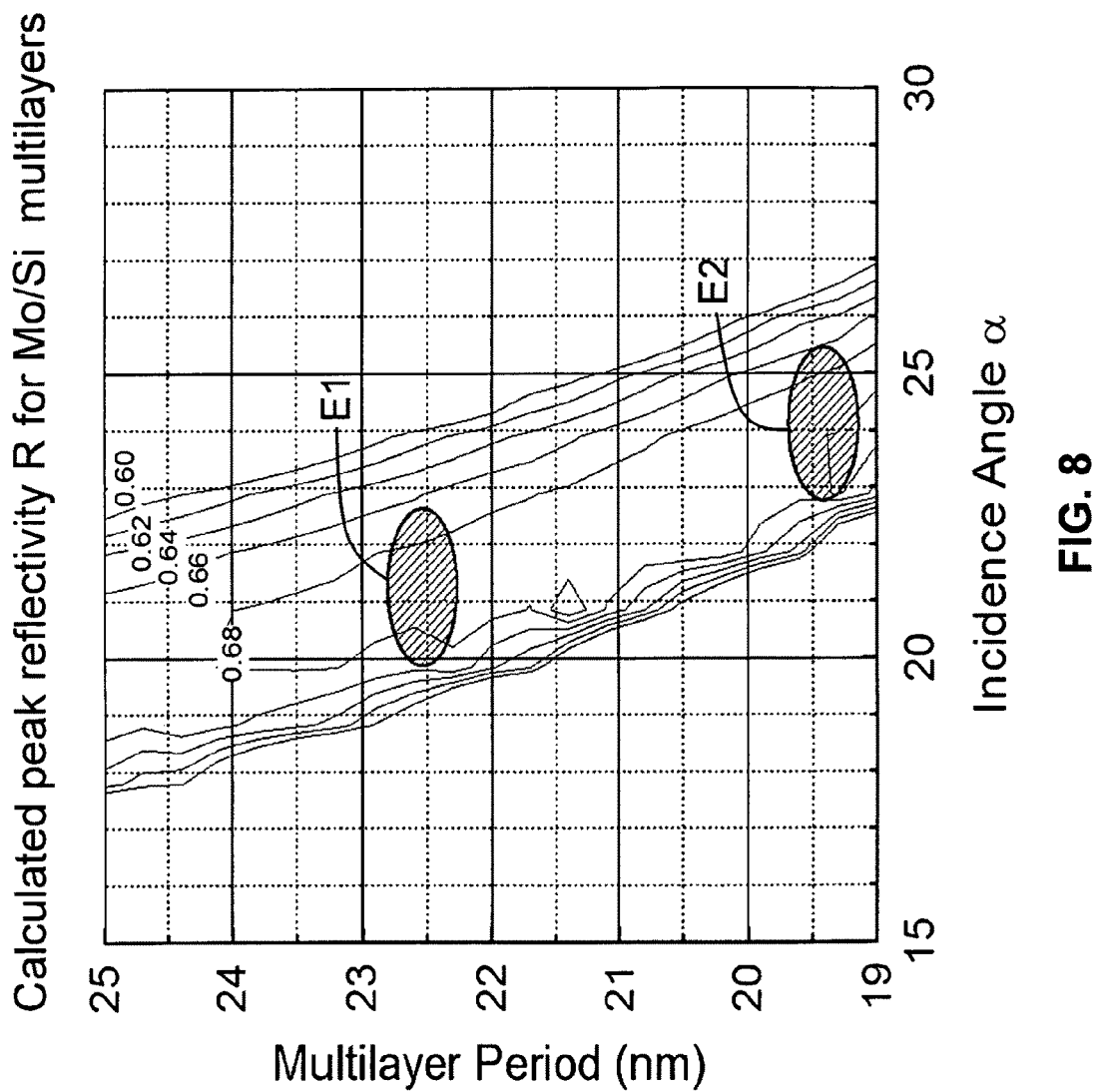
FIG. 8 is a contour plot of the calculated reflectivity R for Mo/Si multilayers as a function of the multilayer period (nm) and grazing incidence angle α (degrees), illustrating the tolerances on the multilayer period and the grazing incident angle.

FIG. 8 is a contour plot of the calculated reflectivity R for Mo/Si multilayers as a function of the multilayer period (nm) and grazing incidence angle $\alpha$ (degrees). The two ellipses E1 and E2 represent areas where an optimal reflectivity coefficient R can be obtained over a given grazing incidence angle range $\Delta\alpha$. In particular, ellipse E1 has an associated grazing incidence angle range $\Delta\alpha_1$ of about $20°\leq\alpha\leq22.5°$ and ellipse E2 has an associated grazing incidence angle range $\Delta\alpha_2$ of about $22.5°\leq\alpha\leq25°$. Fluctuations on the order of +/−1% in the multilayer period (i.e., the vertical dimension of the ellipses) do not result in a significant loss of reflectivity R. Thus, there is a reasonable tolerance on the variation in the multilayer period for the given grazing incidence angle range $\Delta\alpha$.

An example distribution of zones Zn on a zone-optimized mirror MZ designed to handle grazing incidence angles $\alpha$ of up to 25° or so based on the above design and tolerance considerations is as follows: For $\Delta\alpha_1$ of $0<20°$, a pure Mo coating; for $\Delta\alpha_2$ of $20°\leq\alpha\leq22.5°$, a Mo/Si multilayer coating with 22.5 nm period and a tolerance +/−1%; and for $\Delta\alpha_3$ of $22.5°\leq\alpha\leq25°$, a Mo/Si multilayer coating with a 19.4 nm period and a tolerance +/−1%. This provides a simple, robust design for a zoned-optimized mirror MZ having close to maximal reflectivity R over a total grazing incidence angle range $\Delta\alpha=\Delta\alpha_1+\Delta\alpha_3+\Delta\alpha_3$ of about $0°\leq\alpha\leq25°$.

Optical System With Zone-Optimized Mirrors

Aspects of the present invention include EUV and X-ray optical systems that include at least one zone-optimized mirror MZ. An example of such an optical system is described in connection with an EUV collector. Such a collector can be used, for example, in an EUV microlithography system. The example EUV collector utilizes a combination of Mo/Si and Ru reflective coatings and operates over an angular range of $\Delta\alpha\sim40°$. Compared to similar designs based on a single Ru coating, the present design uses as few as four mirrors as compared to the usual eight to twelve mirrors.

Figure 9A:
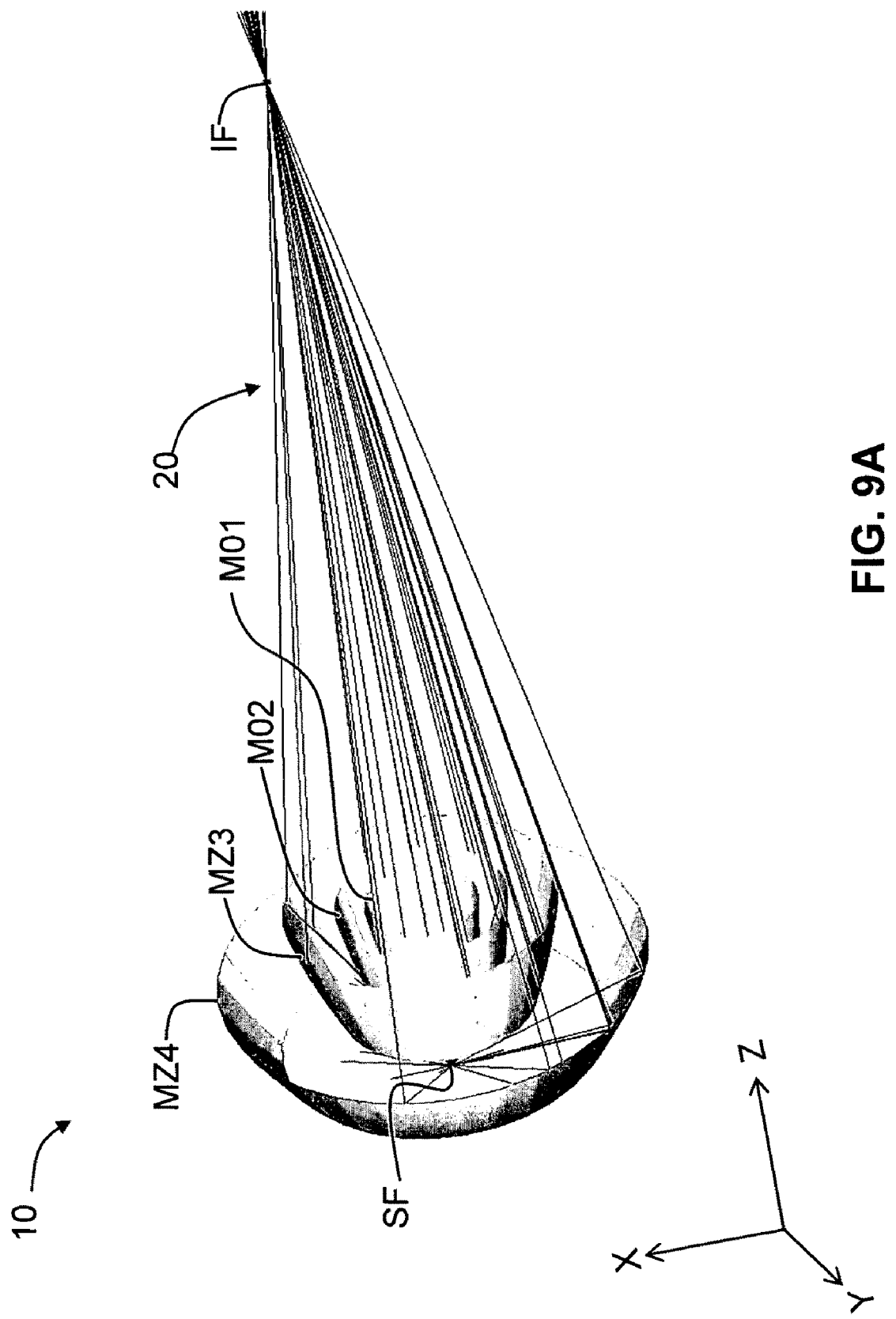
FIG. 9A is a perspective view of an example EUV collector that consists of two conventional mirrors and two zone-optimized mirrors.
Figure 9B:
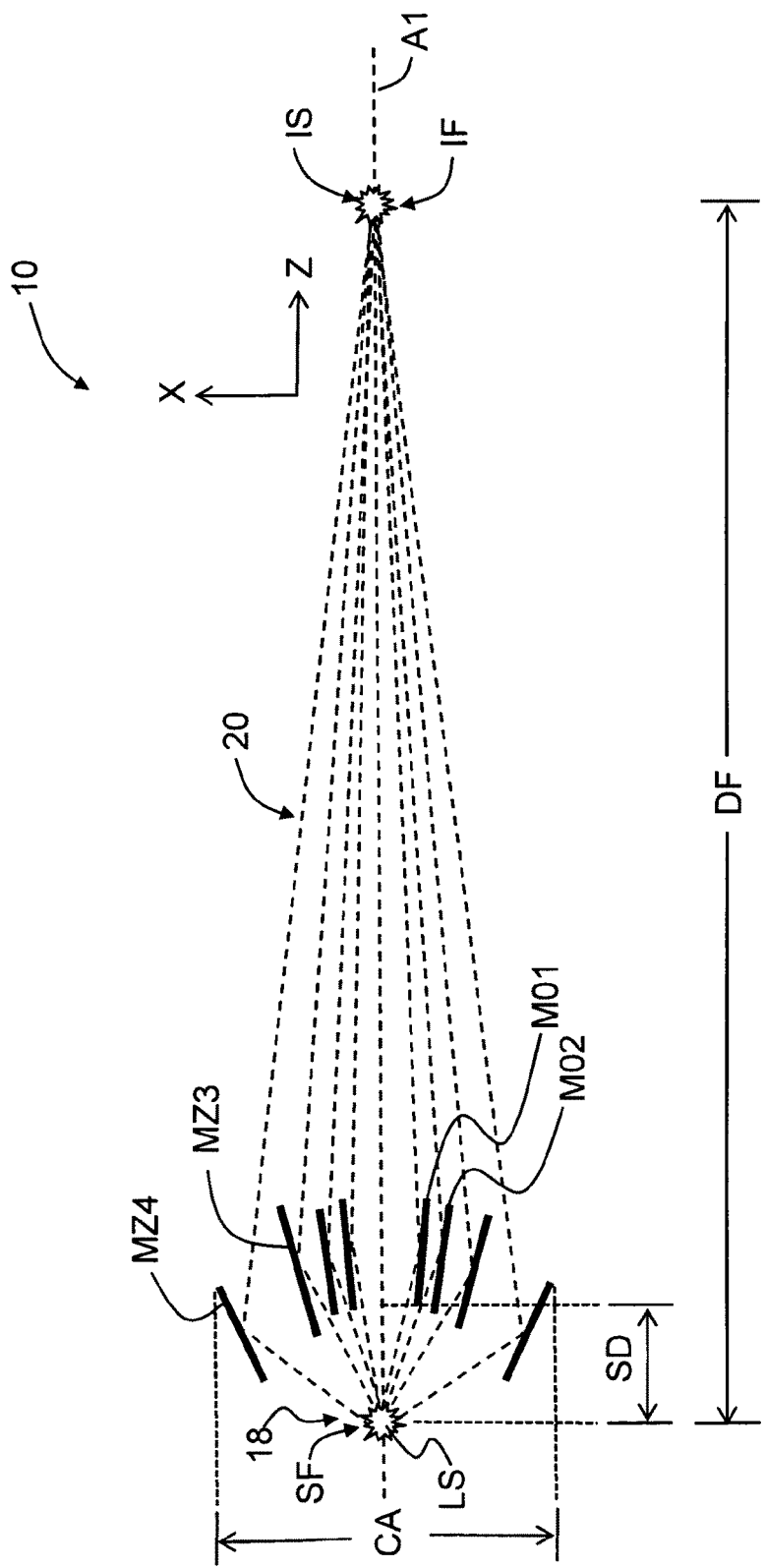
FIG. 9B is a schematic cross-sectional view of the EUV collector of FIG. 9A.

FIG. 9A is a perspective view of an example EUV collector 10 that includes two conventional mirrors M0 and two zone-optimized mirrors MZ. Cartesian coordinates (X-Y-Z) are shown for the sake of reference. FIG. 9B is a schematic cross-sectional view of the EUV collector 10 of FIG. 9A as viewed in the X-Z plane. EUV collector 10 consists of four nested elliptical mirrors arranged concentrically about an optical axis A1, wherein the two innermost mirrors M01 and M02 are conventional mirrors that have a single-layer Ru coating. The two outermost mirrors MZ3 and MZ4 are zone-optimized mirrors that respectively include multiple zones Z1 ... Zx and Z1 ... Zy, as discussed in greater detail below. EUV collector 10 has a clear aperture CA, which is the equal to the diameter of outermost zone-optimized mirror MZ4. In an example embodiment, CA=698 mm.

EUV collector 10 also includes along optical axis A1 a source focus SF and a corresponding (i.e., conjugate) intermediate focus IF. A light source LS is shown at source focus SF. Light source LS generates radiation 18 and associated light rays 20. The axial distance from light source LS to mirrors M is the "source-optics" distance SD, and in an example embodiment SD=200 mm.

Figure 9C:
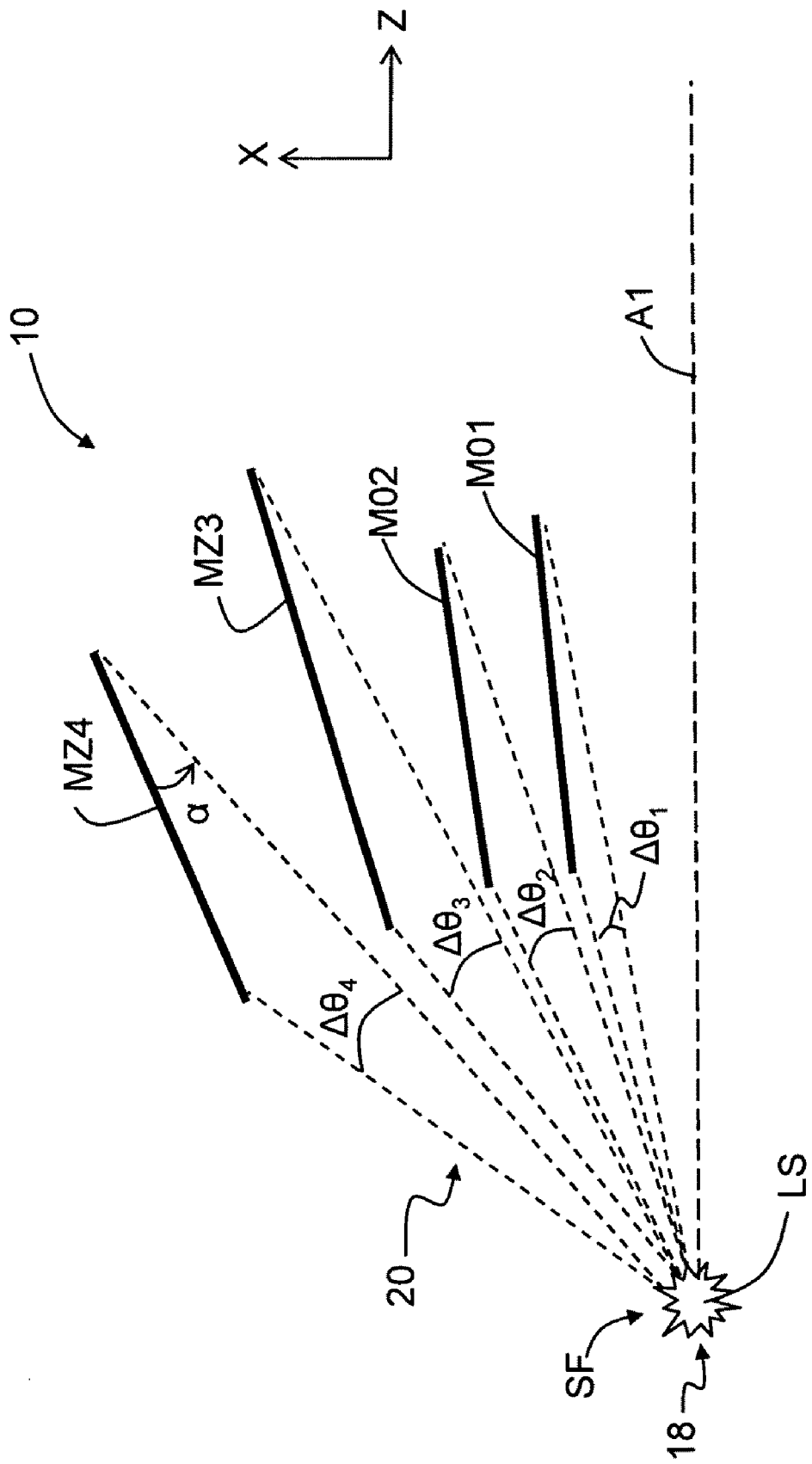
FIG. 9C is a close-up cross-sectional view of the upper portion of the EUV collector of FIG. 9A and FIG. 9B, showing the source angular ranges $\Delta\theta_1$, $\Delta\theta^2$, $\Delta\theta^3$ and $\Delta\theta_4$ corresponding to respective mirrors M01, M02, MZ3 and MZ4.

FIG. 9C is a close-up cross-sectional view (X-Z plane) of the upper portion of EUV collector 10 showing the source angular ranges $\Delta\theta_1$, $\Delta\theta_2$, $\Delta\theta_3$ and $\Delta\theta_4$ corresponding to respective mirrors M01, M02, MZ3 and MZ4. Light 20 from each of these angular regions is focused by the corresponding mirrors to form an intermediate source image IS at intermediate focus IF, as shown in FIG. 9B. The distance between source focus SF and intermediate focus IF is DF, and in an example embodiment DF=2200 mm. Note that EUV collector 10 is a "single reflection" design wherein light rays 20 undergo no more than one reflection between light source LS and intermediate image IS (i.e., between the conjugate foci SF and IF).

Figure 10B:
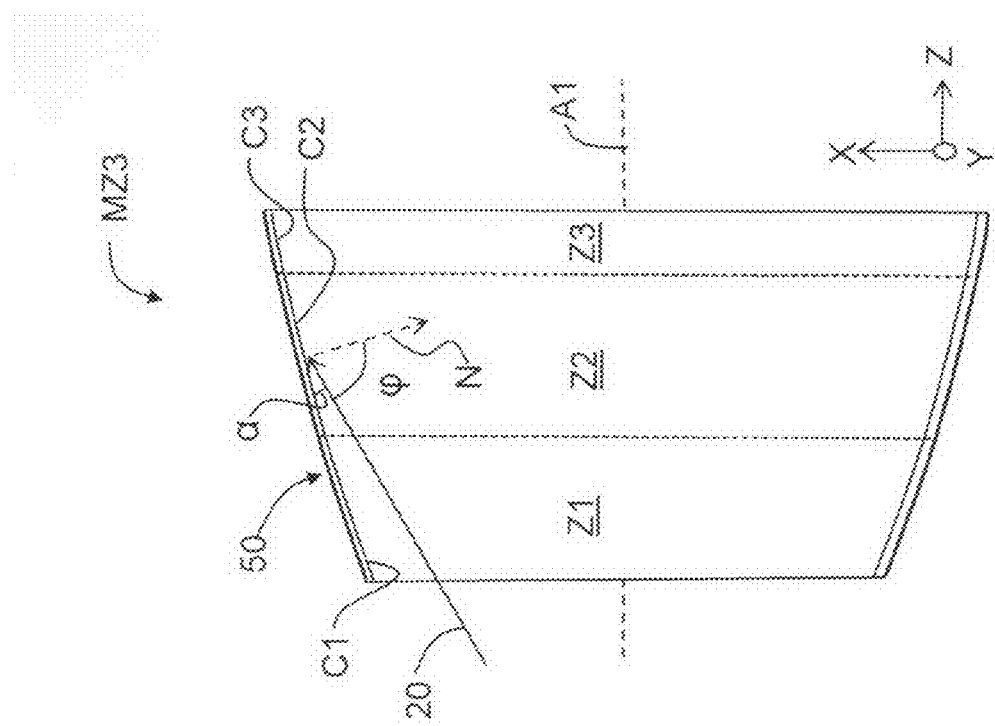
FIG. 10A is a perspective view and FIG. 10B is a cross-sectional view (taken in the X-Z plane) of zone-optimized mirror MZ3 of the EUV collector of FIGS. 9A-9C, showing its three zones Z1, Z2 and Z3.
Figure 10A:
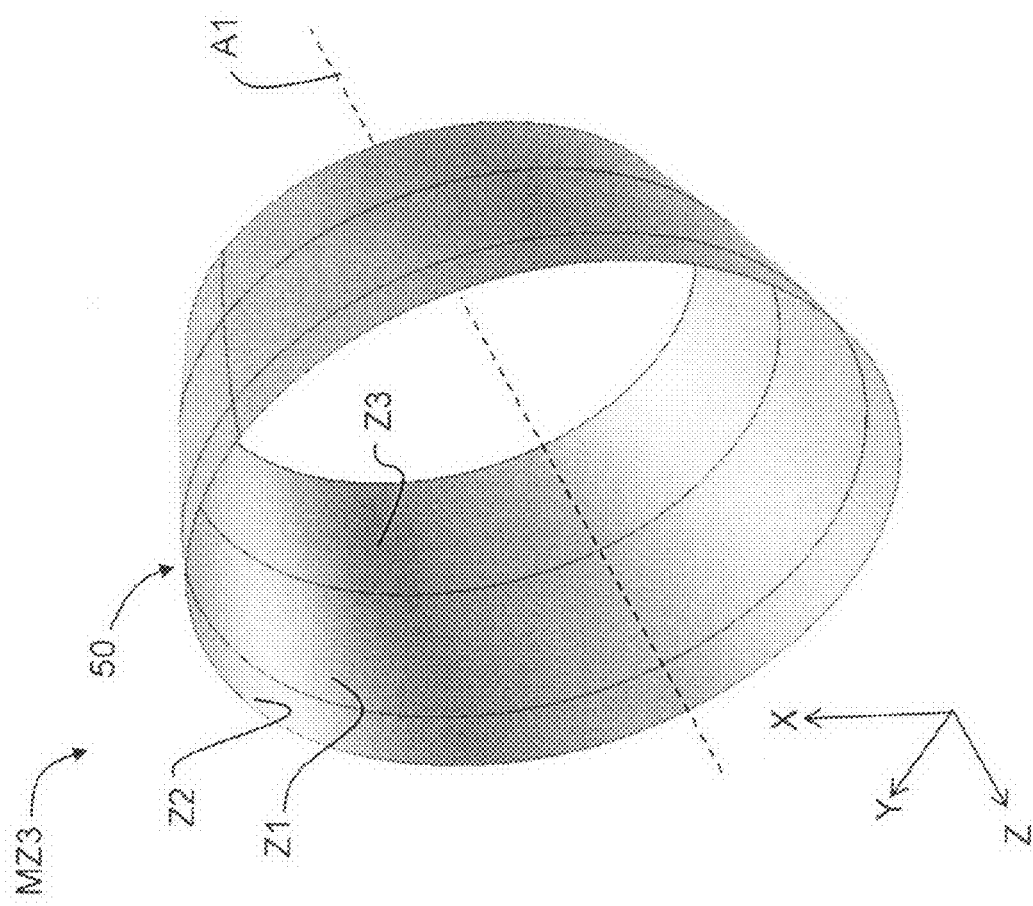

FIG. 10A is a perspective view and FIG. 10B is a cross-sectional view (taken in the X-Z plane) of zone-optimized mirror MZ3 and its three zones Z1, Z2 and Z3. The coatings C1, C2 and C3 for respective zones Z1 through Z3 is summarized in Table 1, below, and the coatings C1 and C2 for zones Z1 and Z2 for mirror MZ4 are summarized in Table 2 below. FIG. 10B also shows an example grazing incidence light ray 20 and its grazing incidence angle $\alpha$ and incidence angle $\phi$ for the sake of reference. Coatings Cn are supported by a shell-like electroformed monolithic structure 50 having the requisite curvature as indicated below.

TABLE 1

Zone parameters for mirror MZ3

| Zones Zn | $\Delta\alpha$ | Coatings Cn |
|---|---|---|
| Z1 | $\alpha < 20°$ | Mo single-layer coating |
| Z2 | $20° \leq \alpha \leq 22.5°$ | Mo/Si multilayer with period 22.5 nm |
| Z3 | $22.5° < \alpha$ | Mo/Si multilayer with period 19.4 nm |

TABLE 2

Zone parameters for mirror MZ4

| Zones Zn | $\Delta\alpha$ | Coatings Cn |
|---|---|---|
| Z1 | $\alpha < 37°$ | Mo/Si multilayer with period 13.0 nm |
| Z2 | $\alpha > 37°$ | Mo/Si multilayer with period 11.5 nm |

The design parameters of EUV collector 10 are listed in Table 3, below.

TABLE 3

Design Parameters

| Parameter | Value |
|---|---|
| Source-IF distance (DF) | 2200 mm |
| Source-optics distance (SD) | 200 mm |
| Minimum collected angle | 14.2° |
| Maximum collected angle | 76.3° |
| Minimum NA at IF | 2° |
| Maximum NA at IF | 10° |
| Maximum diameter (CA) | 698 mm |
| Efficiency in $2\pi$ | 34.8% |

It is noted that the optical design allows collecting up to collection angles of 76.3° with only four mirrors. This is a remarkable advantage with respect to prior art designs based on two-reflection mirrors (e.g. Wolter type mirrors) in which many more mirrors are needed to cover equivalent collection angles. A typical number of mirrors for a corresponding prior art system would be between ten and fourteen. The geometric dimension of the elliptical collector and the required volume are similar to those typical of prior art designs. For example, the largest diameter in the system is about 700 mm, which is a typical of a two-reflection configuration. It is also noted that variations of the four-mirror design are available so that the design can generally have between four and six mirrors Table 4 sets below forth the lens design values ("prescription") for an example EUV collector 10.

TABLE 4

Lens Design Values

| Mirror # | Ellipse parameters | | Mirror minimum radius | | Mirror maximum radius | |
|---|---|---|---|---|---|---|
| | Conic Constant | Radius of curvature [mm] | Position [mm] | Radius [mm] | Position [mm] | Radius [mm] |
| M1 | −0.987407085 | 13.9403 | 187.2424 | 70.2870 | 366.6667 | 93.0568 |
| M2 | −0.971677347 | 31.6057 | 174.8119 | 105.0043 | 366.6667 | 141.5558 |
| MZ3 | −0.933571995 | 75.6258 | 147.5006 | 160.7172 | 366.6667 | 224.4407 |
| MZ4 | −0.824147291 | 213.0784 | 64.3748 | 263.7777 | 219.7368 | 349.1738 |

Figure 11:
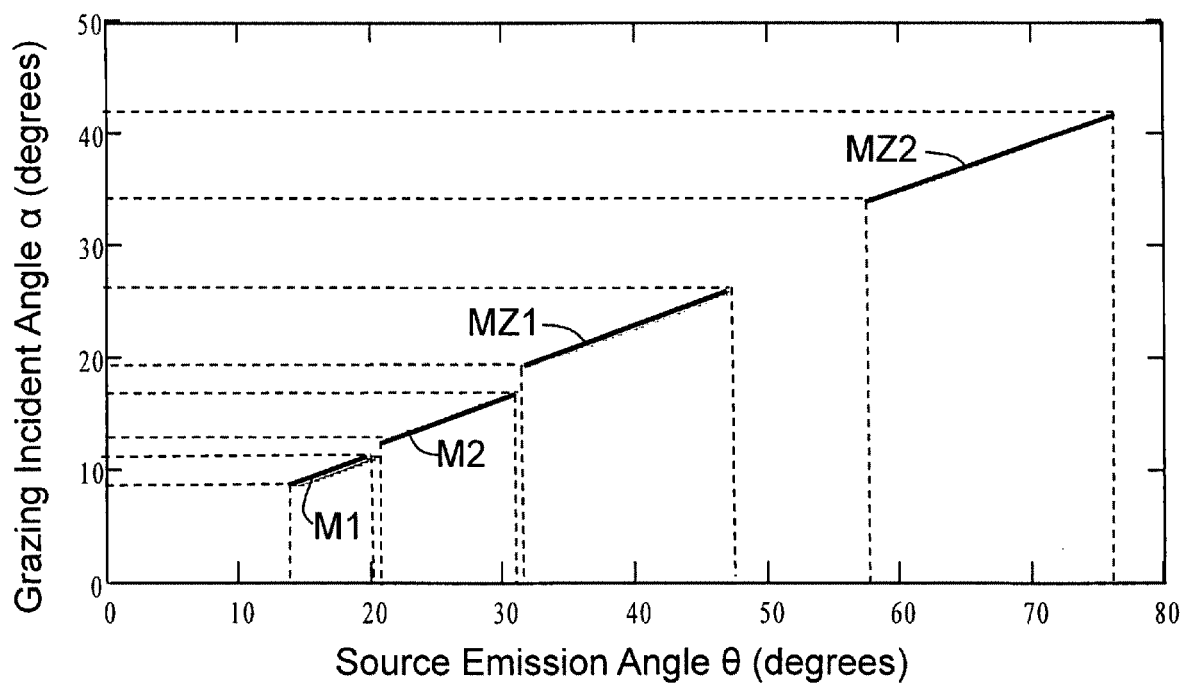
FIG. 11 is a plot of the grazing incidence angle α (degrees) versus the source emission angle θ (degrees) for the EUV collector of FIGS. 9A-9C, illustrating the grazing incidence angle range for each mirror.

FIG. 11 is a plot of the grazing incidence angle α (degrees) versus the source emission angle θ (degrees) for the four mirrors M01, M02, MZ3 and MZ4, illustrating the grazing incidence angle range for each mirror relative the corresponding source emission angular range Δθ. The plot shows that the grazing incidence angle range Δα for zone-optimized mirror MZ3 is about $20° \leq \alpha \leq 25°$ (as discussed above in connection with FIG. 10A and FIG. 10B), and for zone-optimized mirror MZ4 is about $33° \leq \alpha \leq 41°$. Over these grazing incidence angle ranges, the reflectivity R of any single-layer coating, including Ru, would be relatively small for mirror MZ3 and practically zero for mirror MZ4. Thus, without respective zone-optimized reflective coatings for mirrors MZ3 and MZ4, a single-reflection, four-mirror design for EUV collector 10 is not possible, and a prior-art two-reflection design with more mirrors (typically eight to twelve shell mirrors) must be used.

Another important feature of the single-reflection design of EUV collector 10 is that it has fewer mirror edge obscurations, thus improving the optical performance. Since each mirror in the four-mirror single reflection design of EUV collector 10 collects radiation over a larger solid angle as compared to the corresponding nested two-reflection mirror design, the thermal load on each mirror is greater. However, one skilled in the art will recognize that there is also greater room available on and adjacent the backside of each mirror for suitable mirror-cooling devices to handle the increased thermal load.

EUV Lithography System

Figure 12:
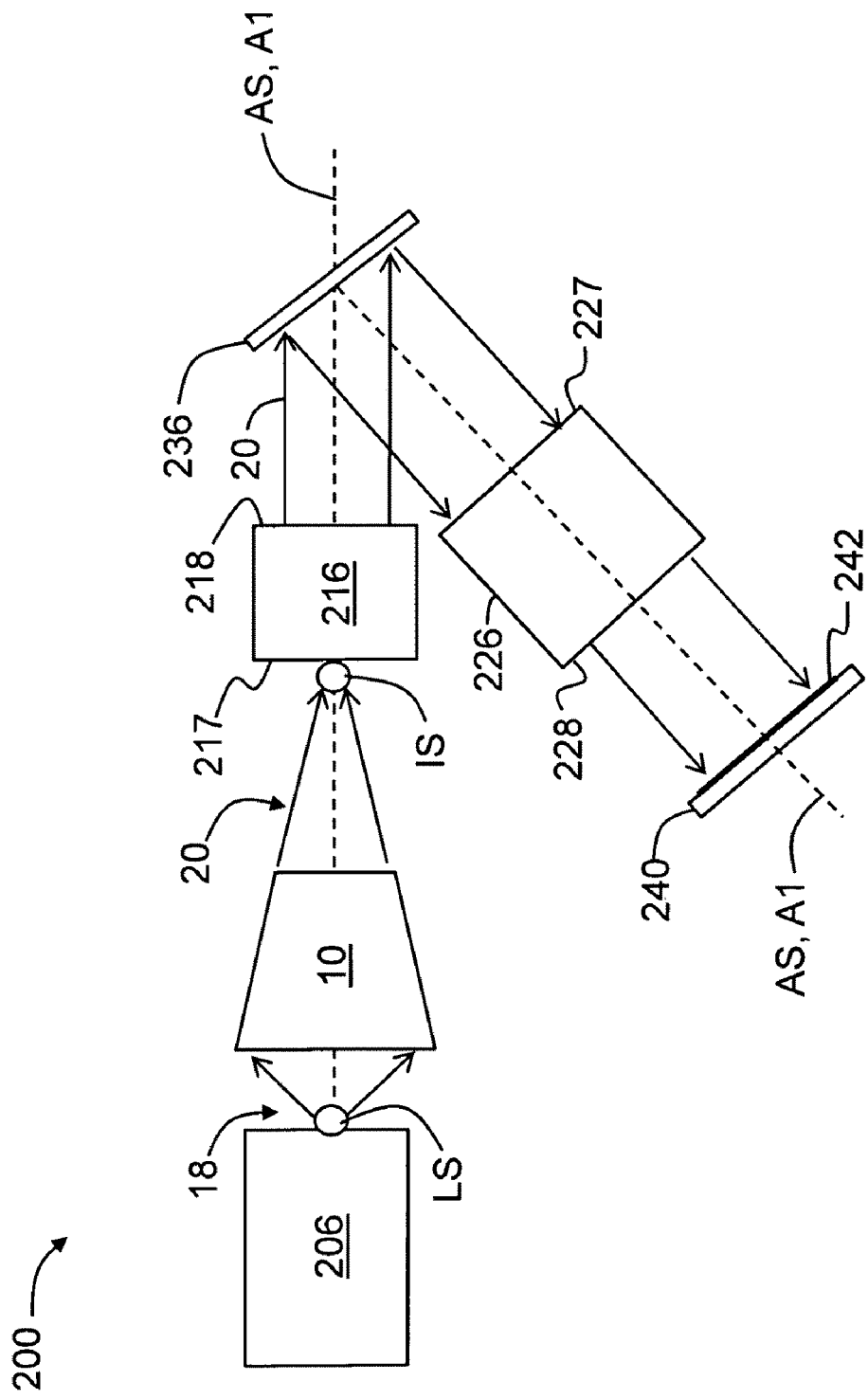
FIG. 12 is a schematic diagram of an EUV lithography system that includes the EUV collector of FIG. 9A and FIG. 9B, as used to pattern a semiconductor wafer.

FIG. 12 is an example EUV lithography system ("system") 200 according to the present invention. System 200 includes a system axis AS and EUV light source 206, such as a hot plasma source that emits radiation 18 at λ=13.5 nm. Radiation 18 is generated, for example, by an electrical discharge source (e.g., a discharged produced plasma, or DPP source), or by a laser beam (laser-produced plasma, or LPP source) on a target of Lithium, Xenon or Tin. Radiation 18 emitted from such a source is roughly isotropic and, in current DPP sources, is limited by the discharge electrodes to a source emission angle of about θ=60° or more from optical axis AS. Example EUV lithography systems are disclosed, for example, in U.S. Patent Applications No. US2004/0265712A1, US2005/0016679A1 and US2005/0155624A1, which Applications are incorporated herein by reference.

System 200 includes an EUV collector 10, such as that described above, that includes at least one zone-optimized mirror MZ. EUV collector 10 is arranged immediately adjacent and downstream of EUV light source 206, with collector axis A1 lying along system axis AS. EUV collector 10 collects radiation 18 (i.e., light rays 20) from EUV light source 206 located at source focus SF and the collected radiation forms intermediate source image IS at intermediate focus IF. An illumination system 216 with an input end 217 and an output end 218 is arranged along system axis AS and immediately adjacent and downstream of EUV collector 10 with the input end immediately adjacent the EUV collector. Illumination system 216 receives at input end 217 light rays 20 from source image IS and outputs at output end 218 a substantially uniform EUV radiation beam 220.

A projection optical system 226 is arranged along (folded) system axis A1 downstream of illumination system 216. Projection optical system 226 has an input end 227 facing illumination system output end 218, and an opposite output end 228. A reflective reticle 236 is arranged adjacent the projection optical system input end 227 and a semiconductor wafer 240 is arranged adjacent projection optical system output end 228. Reticle 236 includes a pattern (not shown) to be transferred to wafer 240, which includes a photosensitive coating (e.g., photoresist layer) 242. In operation, the uniformized EUV radiation beam irradiates reticle 236 and reflects therefrom, and the pattern thereon is imaged onto photosensitive surface 242 of wafer 240 by projection optical system 226. Patterned wafer 240 is then processed using standard photolithographic and semiconductor processing techniques to form integrated circuit (IC) chips.

Because EUV collector 10 is used, system 200 is more efficient than its prior art counterparts. This translates into a greater amount of EUV radiation transmitted by the system and thus a greater throughput (e.g., wafers per unit time processed).

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A zone-optimized mirror for reflecting extreme ultraviolet (EUV) or X-ray radiation, comprising:
    a contiguous reflective surface having two or more substantially discrete zones that include respective different coatings, with each coating configured to reflect a select range of incident angles of the EUV or X-ray radiation incident thereon; and
    wherein at least one of the coatings consists of a single layer of material, and wherein at least one of the other coatings consists of either a single layer of material or multiple layers of material.

2. The zone-optimized mirror according to claim 1, wherein at least one of the coatings consists of a single layer of Mo, and at least one of the other coatings consists of a single layer of Ru.

3. The zone-optimized mirror according to claim 1, wherein the materials are selected from the group of materials comprising: Mo, Ru and Si.

4. The zone-optimized mirror according to claim 1, wherein the contiguous reflective surface has a shape defined by a section of an ellipsoid.

5. The zone-optimized mirror according to claim 1, wherein the contiguous reflective surface is supported by an electroformed monolithic structure.

6. The zone-optimized mirror according to claim 1, wherein adjacent zones are connected by a smoothly varying transition region.

7. The zone-optimized mirror according to claim 1, wherein each zone has a spatially varying reflectivity.

8. An imaging system for imaging extreme ultraviolet (EUV) or X-ray radiation, comprising at least one zone-optimized mirror of claim 1.

9. The zone-optimized mirror of claim 1, wherein the mirror includes a first plurality of zones that optimally reflect respective grazing incident angular ranges, and a second plurality of zones that optimally reflect respective normal incidence angular ranges.

10. A collector for collecting extreme ultraviolet (EUV) or X-ray radiation from a radiation source, comprising:
   one or more mirrors arranged about an optical axis extending through the radiation source, with at least one of said one or more mirrors being a zone-optimized mirror having a contiguous reflective surface with two or more substantially discrete zones, with each zone having a different coating, with the different coatings respectively configured to optimally reflect a select range of angles of the EUV or X-ray radiation incident thereon; and
   wherein at least one of the coatings consists of a single layer of material, and wherein at least one of the other coatings consists of either a single layer of material or multiple layers of material.

11. The collector according to claim 10, consisting of four to six concentrically arranged mirrors each defined by a section of an ellipsoid, wherein at least two of the mirrors are zone-optimized mirrors.

12. The collector according to claim 11, wherein:
   the next-to-outermost mirror includes three zones; and
   the outermost mirror includes two zones.

13. The collector according to claim 12, wherein:
   the next-to-outermost zone-optimized mirror is configured to selectively reflect a first range of grazing incident angles α between about 20° and about 25°; and
   the outermost zone-optimized mirror is configure to selectively reflect a second range of grazing incident angles a between about 33° and about 41°.

14. The collector according to claim 10, wherein the one or more mirrors define a two conjugate foci, and wherein radiation traveling between the two foci undergo no more than one reflection.

15. The collector according to claim 10, wherein adjacent zones are defined by a smoothly varying reflectivity transition region.

16. An extreme ultraviolet (EUV) or X-ray lithography system for illuminating a reflective mask, comprising:
   a source of EUV or x-ray radiation;
   a collector optical system according to claim 10 configured to receive and form collected radiation; and
   an optical condenser configured to receive the collected radiation and form condensed radiation for illuminating the reflective mask.

17. The EUV or X-ray lithography system of claim 16 for forming a patterned image on a photosensitive semiconductor wafer, further comprising:
   a projection optical system arranged downstream of the reflective mask and configured to receive reflected light from the reflective mask and form the patterned image on the photosensitive semiconductor wafer.

18. A method of forming a zone-optimized mirror for extreme ultraviolet (EUV) or X-ray wavelength radiation, comprising:
   a) dividing a mirror surface into a number $n \geq 2$ of zones $Zn$;
   b) determining for each zone $Zn$ a corresponding incidence angular range of incidence angles for radiation incident on the mirror surface;
   c) determining an optimal coating $Cn$ for each zone $Zn$ that substantially optimizes a reflectivity $Rn$ of radiation for the corresponding incidence angular range; and
   d) forming a contiguous reflective surface by depositing for each zone $Zn$ the corresponding coating $Cn$ that substantially optimizes the reflectivity $Rn$, wherein at least one of the coatings consists of a single layer of material, and wherein at least one of the other coatings consists of either a single layer of material or multiple layers of material.

19. The method of claim 18, wherein adjacent zones are connected by a transition region having a smoothly varying reflectivity.

20. The method of claim 18, further comprising combining a plurality of zone-optimized mirrors each formed by performing acts a) through d) to form an EUV or X-ray optical system.

* * * * *